United States Patent
Park et al.

(10) Patent No.: US 9,673,314 B2
(45) Date of Patent: Jun. 6, 2017

(54) SEMICONDUCTOR DEVICE WITH NON-UNIFORM TRENCH OXIDE LAYER

(71) Applicant: Vishay-Siliconix, Santa Clara, CA (US)

(72) Inventors: Chanho Park, San Jose, CA (US); Ayman Shibib, San Jose, CA (US); Kyle Terrill, Santa Clara, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/794,164

(22) Filed: Jul. 8, 2015

(65) Prior Publication Data

US 2017/0012118 A1    Jan. 12, 2017

(51) Int. Cl.
| | |
|---|---|
| *H01L 29/76* | (2006.01) |
| *H01L 29/40* | (2006.01) |
| *H01L 27/095* | (2006.01) |
| *H01L 29/78* | (2006.01) |
| *H01L 29/10* | (2006.01) |
| *H01L 29/08* | (2006.01) |
| *H01L 29/417* | (2006.01) |
| *H01L 29/66* | (2006.01) |

(52) U.S. Cl.
CPC ........ *H01L 29/7802* (2013.01); *H01L 29/086* (2013.01); *H01L 29/0865* (2013.01); *H01L 29/1095* (2013.01); *H01L 29/404* (2013.01); *H01L 29/407* (2013.01); *H01L 29/41741* (2013.01); *H01L 29/66712* (2013.01)

(58) Field of Classification Search
CPC .............. H01L 29/7802; H01L 29/086; H01L 29/0865; H01L 29/1095; H01L 29/404; H01L 29/407; H01L 29/41741; H01L 29/66712

USPC ................. 257/328, 329, 330, 333, E29.021, 257/E29.118, E29.133, E21.218, E21.252, 257/E21.359; 438/259, 268, 270
See application file for complete search history.

(56) References Cited

U.S. PATENT DOCUMENTS

| | | | |
|---|---|---|---|
| 5,973,360 A | * | 10/1999 | Tihanyi ............... H01L 29/0653 257/330 |
| 6,191,447 B1 | * | 2/2001 | Baliga ............... H01L 29/42368 257/330 |
| 6,620,691 B2 | | 9/2003 | Hshieh et al. |
| 7,078,780 B2 | | 7/2006 | Wu |
| 7,319,256 B1 | | 1/2008 | Kraft et al. |
| 8,247,296 B2 | | 8/2012 | Grivna |

(Continued)

FOREIGN PATENT DOCUMENTS

WO    2012158977    11/2012

OTHER PUBLICATIONS

Yang, Xin; et al., Tunable Oxide-Bypassed Trench Gate MOSFET: Breaking the Ideal Superjunction MOSFET Performanceline At Equal Column Width; IEEE Electron Device Letters, vol. 24, No. 11, Nov. 2003; pp. 704-706.

(Continued)

*Primary Examiner* — Dao H Nguyen

(57) ABSTRACT

A semiconductor device includes a trench formed in an epitaxial layer and an oxide layer that lines the sidewalls of the trench. The thickness of the oxide layer is non-uniform, so that the thickness of the oxide layer toward the top of the trench is thinner than it is toward the bottom of the trench. The epitaxial layer can have a non-uniform dopant concentration, where the dopant concentration varies according to the thickness of the oxide layer.

13 Claims, 14 Drawing Sheets

(56) References Cited

U.S. PATENT DOCUMENTS

| | | |
|---|---|---|
| 8,334,566 B2 | 12/2012 | Tai |
| 8,803,207 B2 | 8/2014 | Grebs |
| 2003/0001203 A1* | 1/2003 | Ono .................. H01L 29/7828 257/330 |
| 2003/0085422 A1 | 5/2003 | Amali et al. |
| 2004/0195620 A1 | 10/2004 | Chuang et al. |
| 2004/0222458 A1 | 11/2004 | Hsieh et al. |
| 2005/0127465 A1 | 6/2005 | Chiola |
| 2005/0133858 A1 | 6/2005 | Banerjee et al. |
| 2005/0167742 A1 | 8/2005 | Challa et al. |
| 2005/0230744 A1 | 10/2005 | Wu |
| 2006/0289929 A1 | 12/2006 | Andrews |
| 2007/0032020 A1 | 2/2007 | Grebs et al. |
| 2007/0155104 A1 | 7/2007 | Marchant et al. |
| 2007/0290234 A1 | 12/2007 | Wu |
| 2008/0166845 A1 | 7/2008 | Darwish |
| 2009/0140327 A1 | 6/2009 | Hirao et al. |
| 2010/0264486 A1* | 10/2010 | Denison ............ H01L 29/42368 257/330 |
| 2011/0084332 A1 | 4/2011 | Kao |
| 2011/0136310 A1 | 6/2011 | Grivna |
| 2011/0165757 A1 | 7/2011 | Kim et al. |
| 2011/0212586 A1 | 9/2011 | Grebs |
| 2011/0254084 A1 | 10/2011 | Terrill et al. |
| 2012/0168897 A1 | 7/2012 | Ma et al. |
| 2013/0020671 A1 | 1/2013 | Lee |
| 2013/0207227 A1 | 8/2013 | Azam et al. |
| 2014/0284700 A1* | 9/2014 | Nozu .................. H01L 29/7813 257/328 |
| 2014/0374825 A1 | 12/2014 | Kelkar et al. |
| 2015/0162401 A1 | 6/2015 | Fadel et al. |

OTHER PUBLICATIONS

Liang, Yung C; "Oxide-Bypassed VDMOS (OBVDMOS): An Alternative to Superjunction High Voltage MOS Power Devices"; IEEE Electron Device Letters, vol. 22, No. 8; Aug. 2001; pp. 107-409.

* cited by examiner

SEMICONDUCTOR DEVICE WITH NON-UNIFORM TRENCH OXIDE LAYER

BACKGROUND

Breakdown voltage provides an indication of the ability of a semiconductor device (e.g., a metal oxide semiconductor field effect transistor (MOSFET) device) to withstand breakdown under reverse voltage conditions. To realize an energy efficient power conversion system, power MOSFETs (e.g., MOSFETs designed to handle medium to high voltage levels) should have low conduction losses. Conduction losses can be lowered by reducing RDS(on), the on-state resistance between the drain and the source. However, reducing RDS(on) adversely affects breakdown voltage.

The drift region in a MOSFET is a relatively high resistivity layer grown by epitaxial (epi) technology, and is designed to achieve particular values for electrical characteristics such as breakdown voltage and on-state resistance. For medium voltage (e.g., 100 V) to high voltage (e.g., 600 V) devices, the major portion of the on-state resistance comes from drift region resistance. For example, for a 200 V device, an analysis shows that 88 percent of the total on-state resistance is due to drift region resistance, while only six percent is due to channel resistance, five percent is due to package resistance, and one percent is due to substrate resistance. Consequently, reducing drift region resistance can make a significant contribution to reducing the total on-state resistance.

However, while a reduction in resistivity in the drift region of the epitaxial layer can positively affect RDS(on), conventionally such a reduction means that breakdown voltage would be expected to be negatively affected as noted above.

Accordingly, a semiconductor device (e.g., MOSFET) that provides reduced resistivity in the drift region and hence lower on-state resistance, but does not negatively impact breakdown voltage, would be valuable.

SUMMARY

In overview, embodiments according to the present invention pertain to semiconductor devices, such as but not limited to power MOSFETs including but not limited to dual trench MOSFETs, that have non-uniform oxide layers lining the trenches that are connected to the source electrode. Such devices will have lower resistivity in the drift region and lower on-state resistance but will have the same or about the same breakdown voltage as conventional but otherwise comparable MOSFETs.

More specifically, in an embodiment, a semiconductor device includes an epitaxial layer disposed adjacent to the substrate layer and trenches formed in the epitaxial layer. An oxide layer lines the sidewalls of each of the trenches. The trenches are filled with a material such as polysilicon that is connected to a source electrode. The oxide layer has a non-uniform thickness along the sidewalls of each trench. For example, the thickness of the oxide layer at a first distance from the bottom of a trench is less than the thickness of the oxide layer at the bottom, and the thickness of the oxide layer at a second distance from the bottom (greater than the first distance) is less than the thickness of the oxide layer at the first distance. Generally, in embodiments according to the invention, the oxide layer is thinnest at or near the top of the trench, and is thicker toward the bottom of the trench.

In an embodiment, the epitaxial layer has a non-uniform dopant concentration. In such an embodiment, the dopant concentration varies according to the thickness of the oxide layer. More specifically, in an embodiment, the dopant concentration is higher where the oxide layer is thinner and lower where the oxide layer is thicker. Thus, in the above example, the dopant concentration at the first distance is less than the dopant concentration at the second distance.

Non-uniform oxide layer thicknesses in the trenches in embodiments according to the present invention provide the opportunity to improve charge balance in the drift region in the epitaxial layer by tailoring the dopant concentration in the epitaxial layer according to the thickness of the oxide layer, resulting in reduced (improved) on-state resistance at the same breakdown voltage.

These and other objects and advantages of embodiments according to the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification. The figures may not be drawn to scale.

DETAILED DESCRIPTION

Figure 1A:
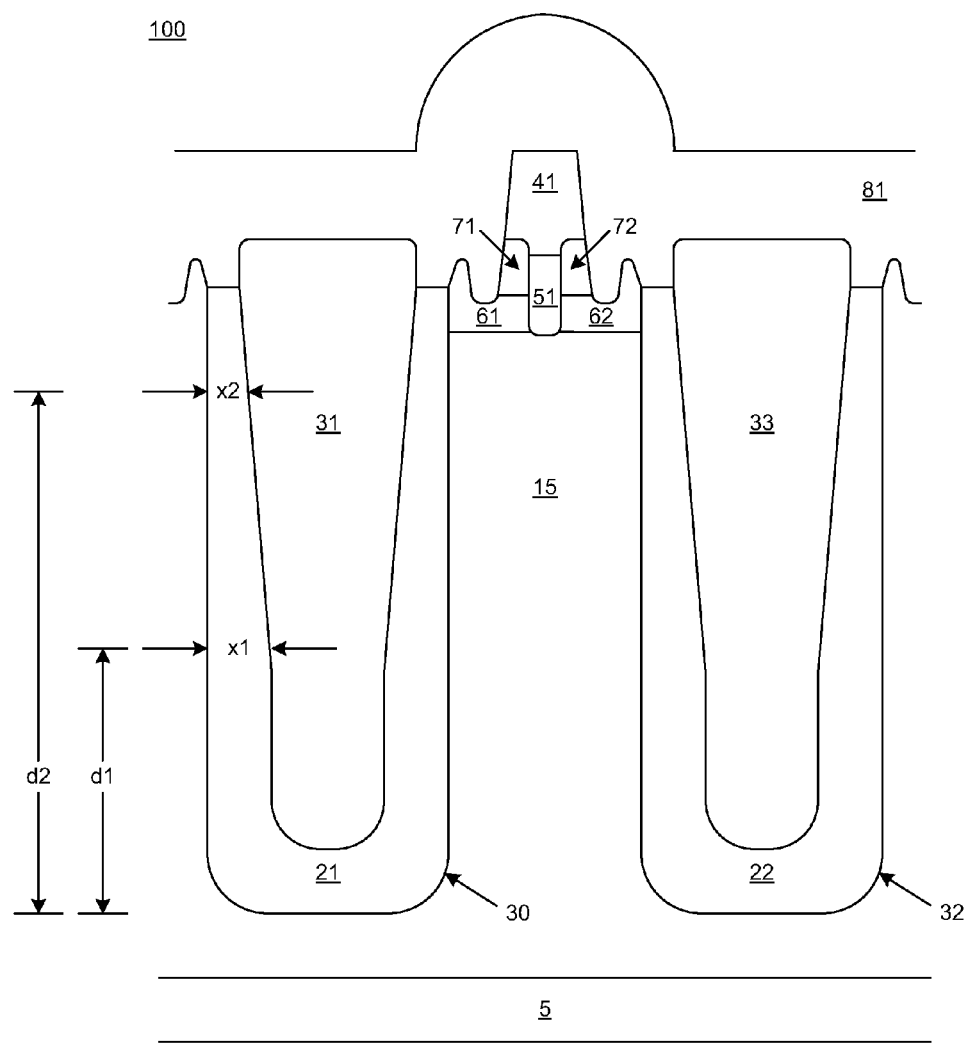
FIG. 1A illustrates an example of a portion of a semiconductor device in an embodiment according to the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching," "adding," "removing" or the like, refer to actions and processes (e.g., process 500 of FIG. 5) of semiconductor device fabrication.

It is understood that the figures are not necessarily drawn to scale, and only portions of the devices and structures depicted, as well as the various layers that form those structures, are shown. For simplicity of discussion and illustration, the process is described for one or two devices or structures, although in actuality more than one or two devices or structures may be formed.

The term "channel" is used herein in the accepted manner. That is, current moves within a MOSFET in a channel, from the source connection to the drain connection. A channel can be made of either n-type or p-type semiconductor material; accordingly, a MOSFET is specified as either an n-channel or p-channel device. The disclosure is presented in the context of an n-channel device; however, embodiments according to the present invention are not so limited. That is, the features described herein can be utilized in a p-channel device. The disclosure can be readily mapped to a p-channel device by substituting, in the discussion, n-type dopant and materials for corresponding p-type dopant and materials, and vice versa.

As used herein, the letter "n" refers to an n-type dopant and the letter "p" refers to a p-type dopant. A plus sign "+" or a minus sign "−" is used to represent, respectively, a relatively high or relatively low concentration of the dopant. For example, "n+" would indicate a higher concentration of n-type dopant than "n," which would indicate a higher concentration of n-type dopant than "n−."

In general, the term "trench" is used in the art to refer to an empty trench that is formed in, for example, an epitaxial (epi) layer, and is also often used to refer to a trench that is partially or completely filled with one or more materials. The term "trench structure" may be used herein at times to distinguish a filled or partially filled trench from an empty or unfilled trench. At other times, the manner in which these terms are being used will be evident from the context of the surrounding discussion.

FIG. 1A is an example of a cross-sectional view of a portion of a semiconductor device 100 in an embodiment according to the present invention. In the example of FIG. 1A, the device 100 includes an epitaxial layer 15 (e.g., an n-type epitaxial layer) formed over and adjacent to a substrate layer 5. The device 100 also includes a first trench structure 31 formed in a first trench 30 that is formed in the epitaxial layer 15, and also includes a second trench structure 33 formed in a second trench 32 formed in the epitaxial layer.

In embodiments according to the present invention, the trench 30 is lined with an oxide layer 21, and the trench 32 is lined with an oxide layer 22. The oxide layers 21 and 22 may be referred to as shield oxides. The oxide layer 21 lines the bottom and sidewalls of the trench 30, and the oxide layer 22 lines the bottom and sidewalls of the trench 32.

In the FIG. 1A embodiment, the volumes within the oxide layers 21 and 22 are filled with material to form the trench structures 31 and 33, respectively. In an embodiment, the material is a polysilicon material. In an embodiment, the material in the trench structures 31 and 33 is connected to a source electrode 81. Accordingly, the trench structures 31 and 33 may be referred to as source trenches.

Significantly, in embodiments according to the present invention, the oxide layers 21 and 22 have non-uniform thicknesses along the sidewalls of the trenches 30 and 32. For example, in the FIG. 1A embodiment, the thickness x1 of the oxide layer 21 at a first distance d1 from the bottom of the trench structure 31 is less than the thickness of the oxide layer at the bottom, and the thickness x2 of the oxide layer at a second distance d2 from the bottom (the second distance greater than the first distance) is less than the thickness of the oxide layer at the first distance. The thickness of the oxide layer 22 can be similarly described.

In the FIG. 1A embodiment, the oxide layers 21 and 22 get thinner as a function of distance from the bottoms of the trenches 30 and 32. In other words, in the FIG. 1A embodiment, the thickness of the oxide layer 21 is not constant or uniform between the distance d1 and the distance d2 or from d2 to the top of the trench 30. The thickness of the oxide layer 22 can be similarly described.

In an embodiment, the thickness of the oxide layer 21 decreases linearly between the distances d1 and d2. That is, the thickness of the oxide layer 21 can essentially be represented using a straight line drawn from d1 to d2. The thickness of the oxide layer 21 can continue to decrease linearly beyond the distance d2 as shown in the example of FIG. 1A. The thickness of the oxide layer 22 can be similarly described.

However, the thicknesses of the oxide layers do not necessarily have to decrease linearly as the distance from the bottom of the trench increases. The oxide layers can have different profiles (cross-sections). In general, the oxide layers are thinnest at or near the top of a trench, and are thicker toward the bottom of the trench.

In the example of FIG. 1A, a structure or device is formed between (adjacent to) the trench structures 31 and 33. In an embodiment, the structure/device includes a trench 51 filled with material (e.g., oxide and polysilicon), body regions 61 and 62 (e.g., p-type body regions), and source regions 71 and 72 (e.g., n-type source regions). In an embodiment, the material in the trench 51 is shielded (insulated) from the source electrode 81 by a dielectric region 41. While a particular type of structure/device between the trench structures 31 and 33 is shown in FIG. 1A and in other figures below (e.g., FIGS. 1B, 2, and 3), embodiments according to the present invention are not so limited. For example, the structure/device may be a type of Schottky device or insulated-gate bipolar transistor (IGBT) instead of the type of structure/device shown in the figures.

In embodiments according to the present invention, the design of the epitaxial layer 15 can be tailored to complement the non-uniform thicknesses of the oxide layers 21 and 22. More specifically, the epitaxial layer 15 can have a non-uniform dopant concentration, where the dopant concentration varies according to the thickness of the oxide layers. Thus, non-uniform oxide layer thicknesses in the trenches in embodiments according to the present invention provide the opportunity to tune the dopant concentration and improve charge balance in the drift region (the region in the epitaxial layer between the trench structures 31 and 33 and under the body regions 61 and 62), in order to reduce resistivity in the drift region and thereby reduce (and improve) the total on-state resistance. Importantly, in embodiments according to the present invention, on-state resistance can be reduced without affecting breakdown voltage.

Figure 1B:
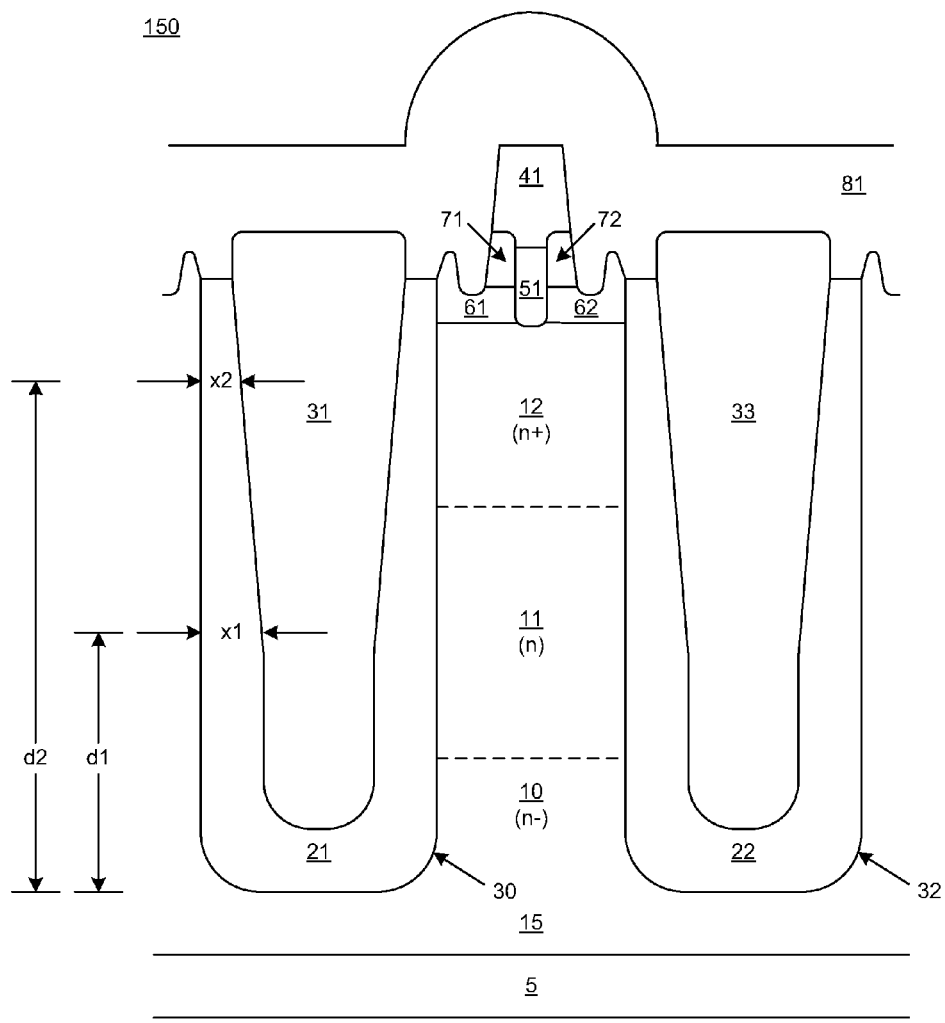
FIG. 1B illustrates an example of a portion of a semiconductor device in an embodiment according to the present invention.

FIG. 1B is an example of a cross-sectional view of a portion of a semiconductor device 150 in an embodiment according to the present invention, in which the dopant concentration varies according to the thickness of the oxide layers. In the example of FIG. 1B, the epitaxial layer 15 includes three sub-layers or regions 10, 11, and 12. In an embodiment, each of the sub-layers 10, 11, and 12 extend across the entire distance between the adjacent trench structures 31 and 33.

In the example of FIG. 1B, the region 10 corresponds to (neighbors, or is adjacent to) the bottom portions of the trench structures 31 and 33, the region 11 corresponds to the distance d1, and the region 12 corresponds to the distance d2. The term "corresponds to," as used above and hereinafter, means that the region 10 overlaps the bottom of the trench structures 31 and 33, the region 11 overlaps portions of the oxide layers 21 and 22 that have a thickness that is greater than the thickness x2, and that the region 12 overlaps portions of the oxide layers 21 and 22 that have a thickness that is less than the thickness x1.

In the example of FIG. 1B, the dopant concentration (e.g., n−) in the region 10 is less than the dopant concentration (e.g., n) in the region 11, and the dopant concentration in the region 11 is less than the dopant concentration (e.g., n+) in the region 12. However, embodiments according to the invention are not so limited. That is, the dopant concentration does not necessarily have to decrease with depth as just described. In general, the dopant concentration is higher where the oxide layer is thinner, and lower where the oxide layer is thicker. Thus, the relative dopant concentrations in different regions of the epitaxial layer 15 can be less than, equal to, or greater than one another depending on the corresponding thickness of the oxide layers 21 and 22. While three dopant concentration levels/regions are described in FIG. 1B and in other figures below (e.g., FIGS. 2 and 3), the present invention is not so limited; there can be more or less than three dopant concentration levels/regions.

According to an analysis of a conventional device versus the device 150, the conventional device has a breakdown voltage of 220 V and an on-state resistance of 12.5 microohms (mΩ), while the device 150 has a breakdown voltage of 220 V and an on-state resistance of 9.7 mΩ. Thus, embodiments according to the invention can improve on-state resistance by 22 percent with the same breakdown voltage relative to a conventional device.

Figure 2:
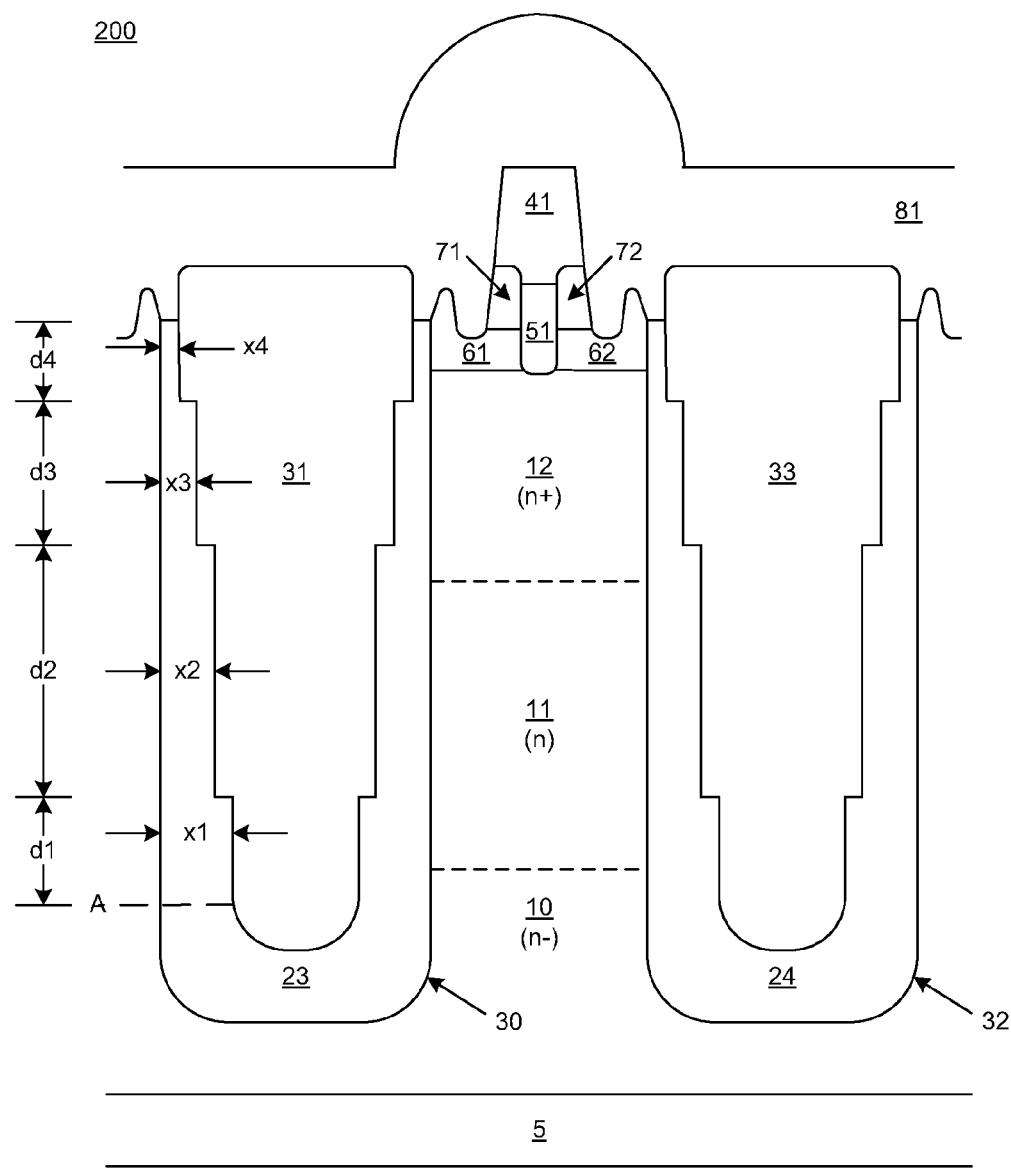
FIG. 2 illustrates an example of a portion of a semiconductor device in an embodiment according to the present invention.

FIG. 2 is an example of a cross-sectional view of a portion of a semiconductor device 200 in an embodiment according to the present invention. In the example of FIG. 2, the oxide layers 23 and 24 are stepped. More specifically, for example, the oxide layer 23 has a uniform first thickness x1 from a point A that is above the bottom of the trench structure 31 to a first distance d1, a uniform second thickness x2 from the distance d1 to a second distance d2, a uniform third thickness x3 from the distance d2 to a third distance d3, and a uniform fourth thickness x4 from the distance d3 to the top surface of the trench structure 31, where x1 is greater than x2, which is greater than x3, which is greater than x4. There can be more or less than the number of steps shown in FIG. 2. The distances d1, d2, d3, and d4 may or may not be equal. The thickness of the oxide layer 24 can be similarly described.

Like the example of FIG. 1B, the device 200 can have non-uniform dopant concentrations in the epitaxial layer as shown in FIG. 2.

Features of the devices of FIGS. 1A, 1B, and 2 can be combined. Specifically, with reference to FIG. 2, one, some or all of the uniformly thick portions of the oxide layers 23 and 24 can instead be decreasing (e.g., decreasing linearly) with distance from the bottom of the trench structure 31. For example, the thickness of the portion of the oxide layer 23 across the length of the distance d1 can decrease as distance from the bottom increases; for example, the thickness in that portion can decrease linearly from x1 to x2 across the distance d1. Similarly, the thickness of each of the other portions of the oxide layer 23 either can be uniform or can decrease (e.g., decrease linearly) as the distance from the bottom increases. The thickness of the oxide layer 24 can be similarly described.

Also, the rate of change (e.g., the slope) of one portion can be different from that of another portion. For example, the thickness of the oxide layer 23 may decrease across the distance d2, and also may decrease linearly across the distance d3, but the rate at which the thickness decreases across d2 may be different than the rate at which the thickness decreases across d3.

Figure 3:
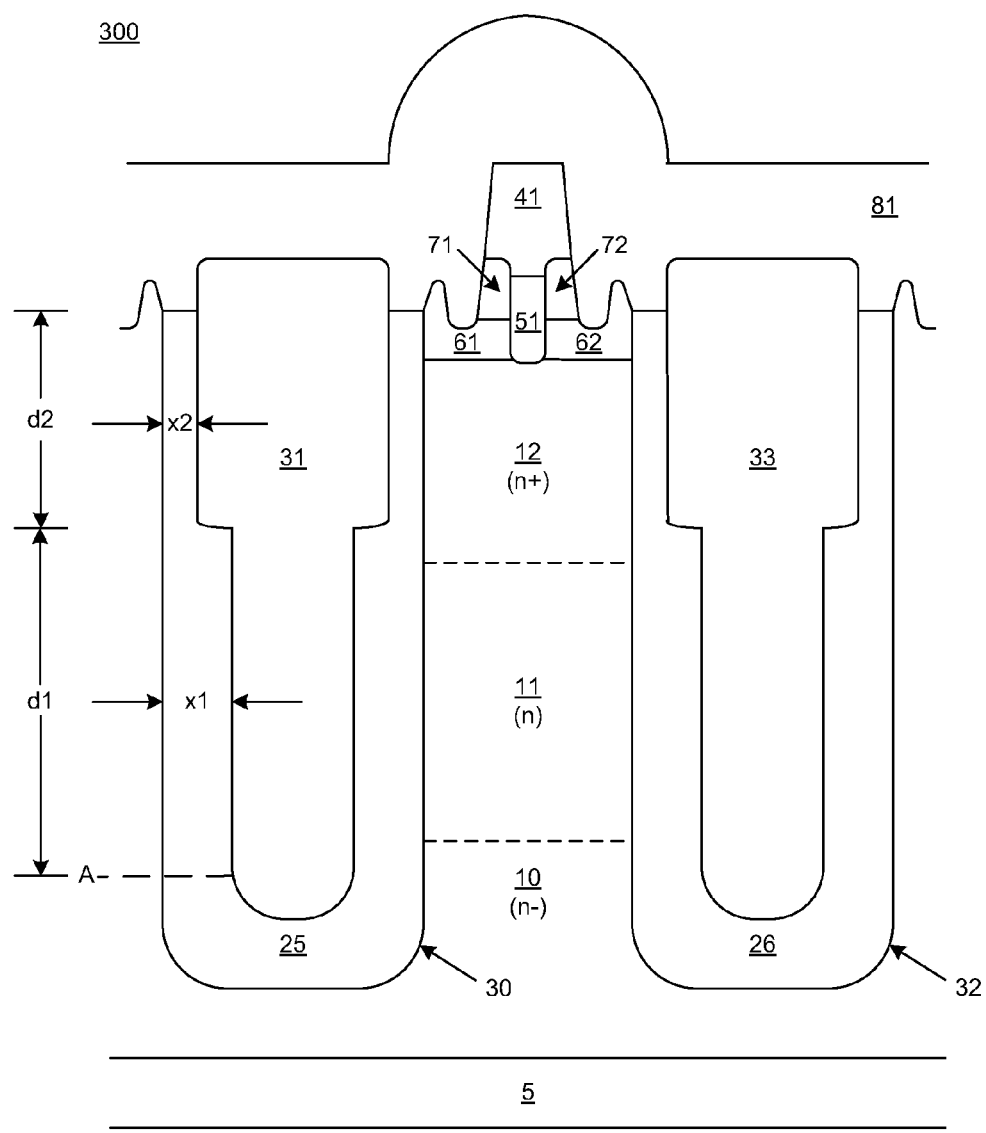
FIG. 3 illustrates an example of a portion of a semiconductor device in an embodiment according to the present invention.

FIG. 3 is an example of a cross-sectional view of a portion of a semiconductor device 300 in an embodiment according to the present invention. In the example of FIG. 3, there is only a single step. More specifically, for example, the oxide layer 25 has a uniform first thickness x1 from a point A that is above the bottom of the trench structure 31 to a first distance d1, and a uniform second thickness x2 from d1 to a second distance d2, where x1 is greater than x2. The thickness of the oxide layer 26 can be similarly described.

Like the examples above, the device 300 can have non-uniform dopant concentration in the epitaxial layer as shown in FIG. 3. Also, features described above can be combined with the features of the device 300. Specifically, one or both of the uniformly thick portions of the oxide layers 25 and 26 can instead be decreasing (e.g., linearly decreasing) with distance from the bottom of the trench structure 31. For example, the thickness of the portion of the oxide layer 25 along the length of the distance d1 can decrease as the distance from the bottom increases; for example, the thickness in that portion can decrease linearly from x1 to x2 across the distance d1. The thickness of the oxide layer 26 can be similarly described.

Figure 4:
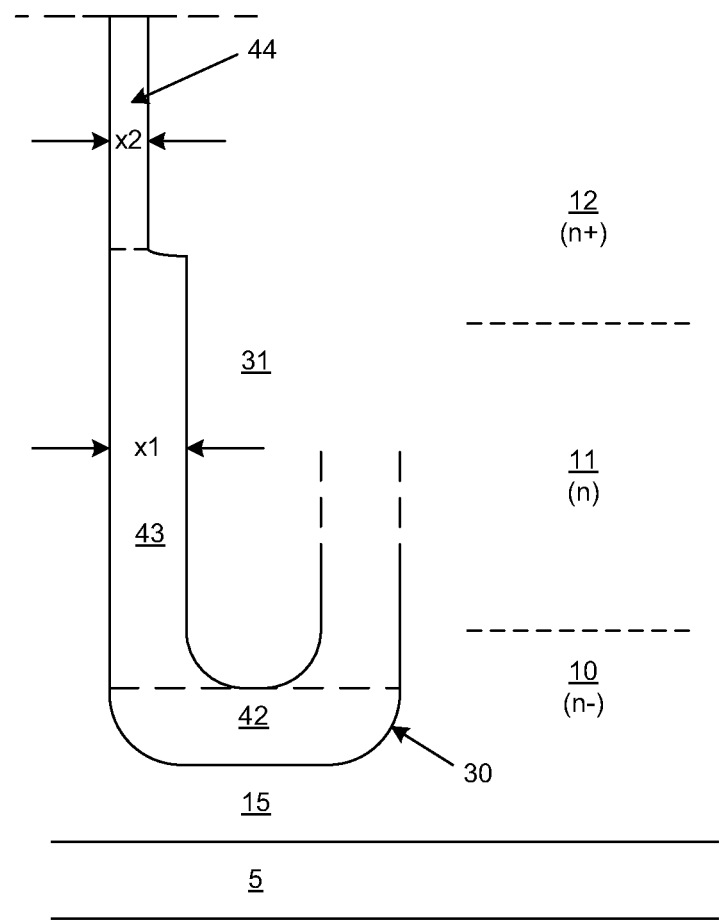
FIG. 4 illustrates an example of a portion of a semiconductor device in an embodiment according to the present invention.

Thus, in general and with reference to FIG. 4, an oxide layer lines the bottom and the first and second sidewalls of the trench 30. The oxide layer, in essence, includes at least: a first portion 42 that spans the bottom of the trench 30 from one sidewall to the other; a second portion 43 that extends from the boundary of the first portion along a sidewall up to a certain height; and a third portion 44 that extends from the boundary of the second portion along the sidewall. The oxide layer has a first thickness (e.g., x1) in the second portion 43 and a second thickness (e.g., x2) in the third portion 44, where the second thickness is less than the first thickness. The first thickness x1 does not necessarily extend along the entire length of the second portion 43; that is, the thickness of the second portion 43 is not necessarily uniform, but can decrease as distance from the bottom of the trench 30 increases. The second thickness x2 can be similarly described.

Furthermore, in an embodiment, the epitaxial layer includes a first region 10 neighboring the first portion 42 of the oxide layer, a second region 11 neighboring the second portion 43 of the oxide layer, and a third region 12 neighboring the third portion 44 of the oxide layer. In an embodiment, the first region 10 has a first dopant concentration, the second region 11 has a second dopant concentration, and the third region 12 has a third dopant concentration. In one such embodiment, the third dopant concentration (e.g., n+) is greater than the second dopant concentration (e.g., n), and the second dopant concentration is greater than the first dopant concentration (e.g., n–).

Figure 5:
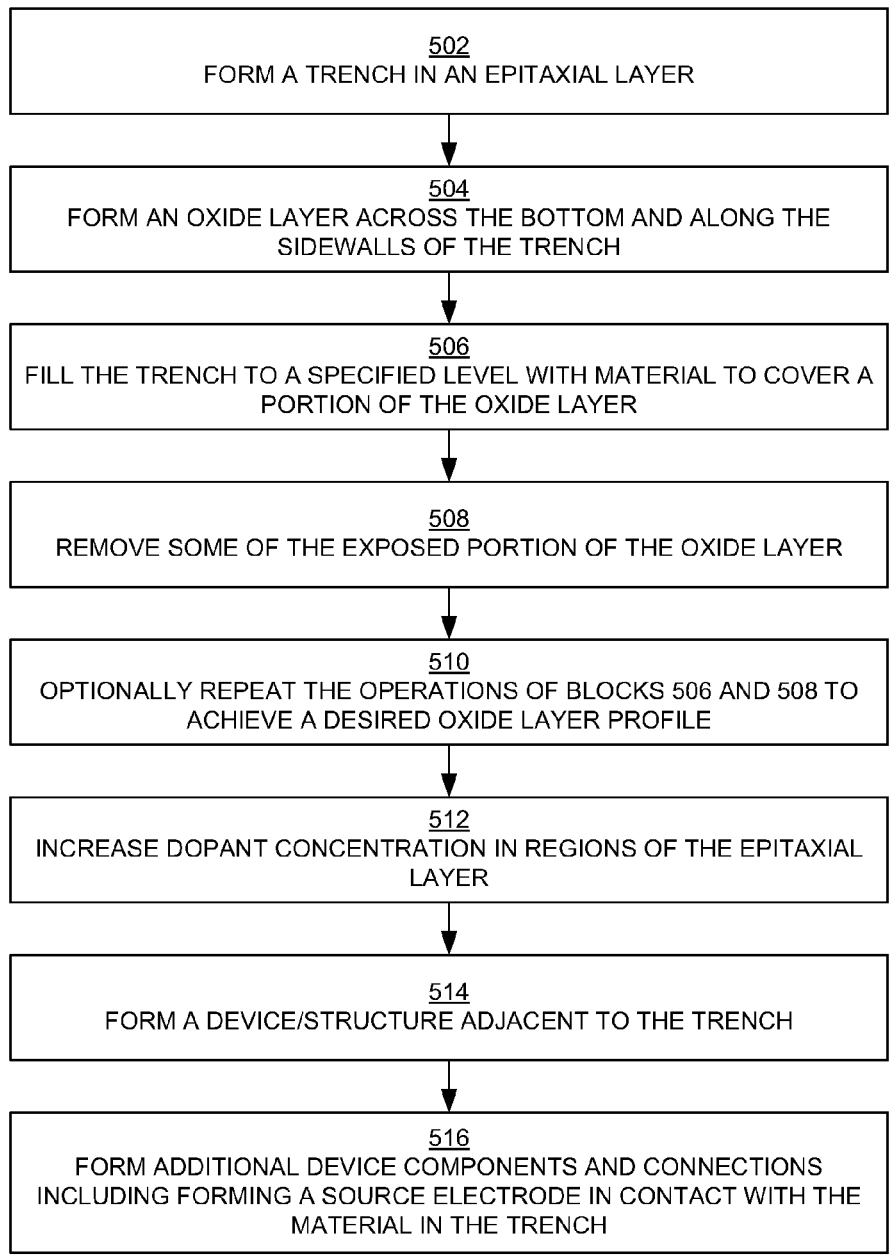
FIG. 5 is a flowchart of an example of operations for fabricating a semiconductor device in an embodiment according to the present invention.

FIG. 5 is a flowchart 500 of a method for fabricating a device in an embodiment according to the present invention. Operations described as separate blocks may be combined and performed in the same process step (that is, in the same time interval, after the preceding process step and before the next process step). Also, the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps. Also, FIG. 5 is discussed in the context of a single trench and trench structure; however, multiple trenches and trench structures can be fabricated in parallel.

Figure 6:
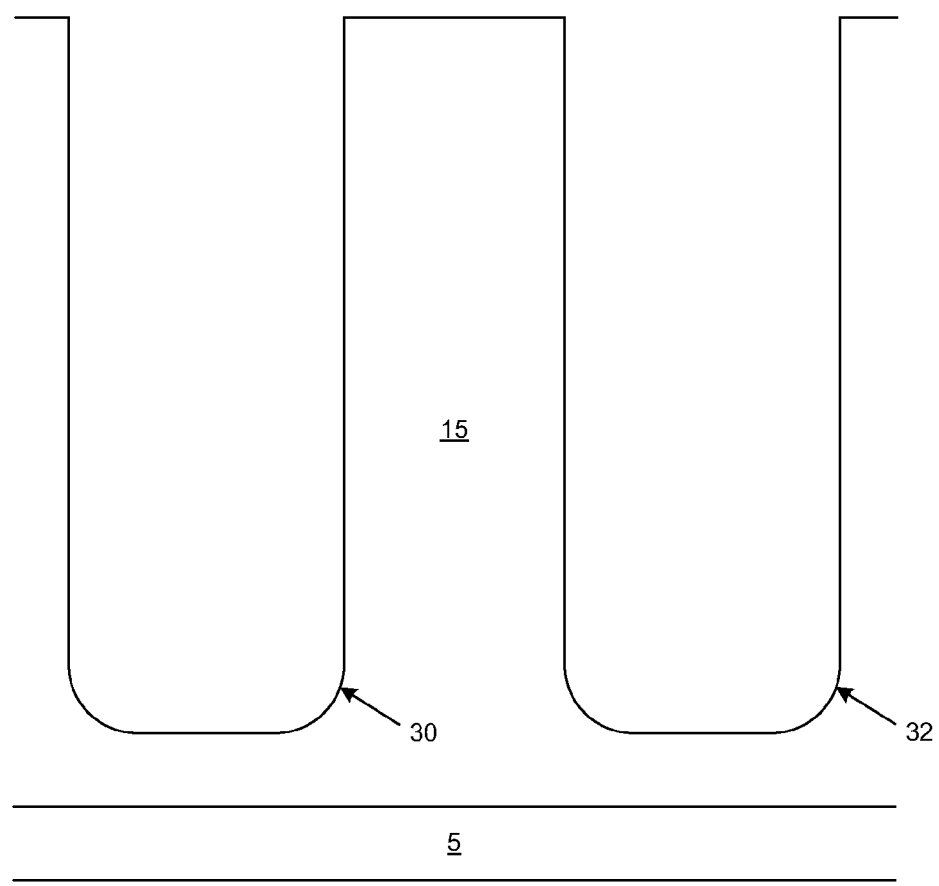
FIGS. 6, 7, 8, 9, 10, 11, 12, and 13 illustrate a portion of a semiconductor device at various stages of a fabrication process in an embodiment according to the present invention.

In block 502 of FIG. 5, and with reference to FIG. 6, a trench 30 is etched in an epitaxial layer 15 that was formed over a substrate 5. In an embodiment, the trench 30 is etched through an oxide hard mask or some other masking material like silicon nitride or photoresist. The masking material is then removed.

Figure 7:
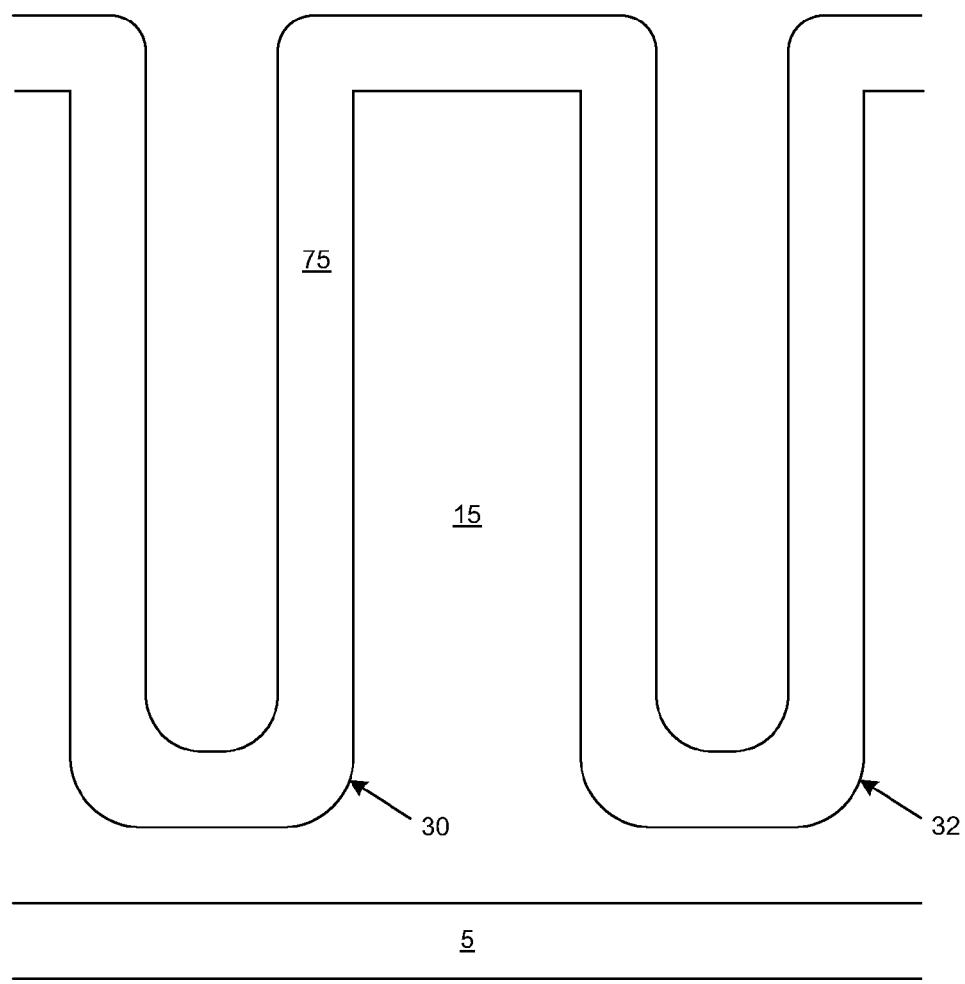

In block 504 of FIG. 5, with reference to FIG. 7, an oxide layer 75 is deposited or grown across the bottom and along the sidewalls of the trench 30 and also over the upper surface of the epitaxial layer 15. The thickness of the oxide layer 75 is determined by the required breakdown voltage ratings. For example, the thickness of the oxide layer 75 is about 0.7 micrometers ($\mu$m) for a device rated at 200 V. In an embodiment, the oxide layer 75 has a uniform thickness along the sidewalls of the trench 30 as shown in the example of FIG. 7. In another embodiment, the oxide layer 75 has a non-uniform thickness; that is, the thickness of the oxide layer is thicker toward the bottom of the trench 30 and gets thinner as the distance from the bottom of the trench increases. In the latter embodiment, the thickness of the oxide layer 75 decreases linearly as the distance from the bottom of the trench 30 increases.

Figure 8:
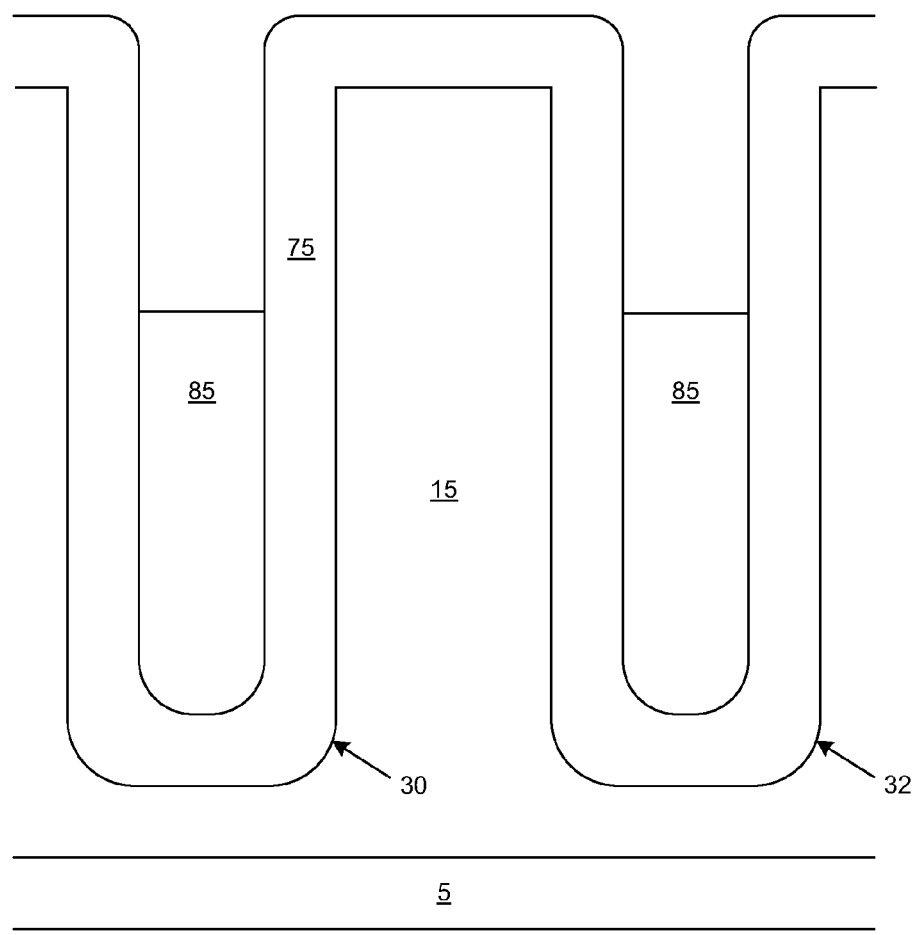

In block 506 of FIG. 5, with reference to FIG. 8, the trench 30 is filled to a specified depth with a material 85 such as doped polysilicon. In an embodiment, the material 85 is deposited past the specified depth, and then etched back to the specified depth. Instead of depositing doped polysilicon, polysilicon can be deposited and then doped by a well-known method using $POCl_3$ (phosphorus oxychloride) or phosphorus implantation and drive-in.

Figure 9:
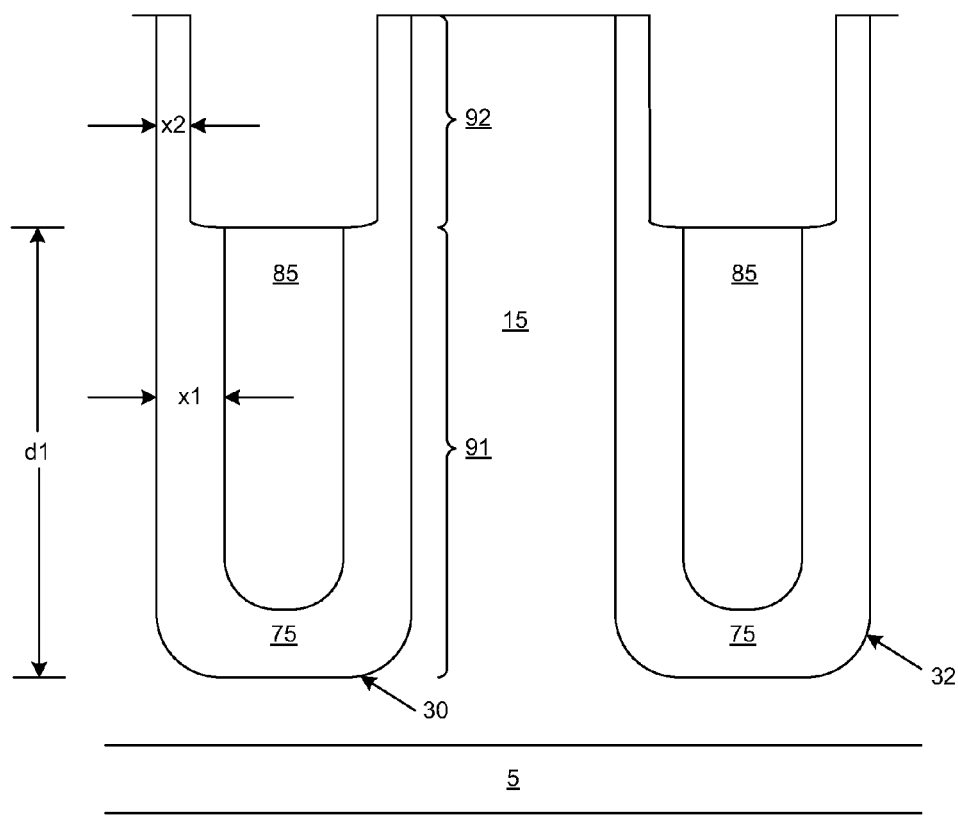

In block 508 of FIG. 5, with reference to FIG. 9, the oxide layer 75 is etched back to a specified depth (e.g., the distance d1, measured from the bottom of the trench 30). In essence, the material 85 masks the lower portion 91 of the oxide layer 75, so that the lower portion of the oxide layer is not etched back. In an embodiment, only some of the oxide layer 75 is removed in the upper portion 92. As a result, the thickness x2 of the upper portion 92 of the oxide layer 75 is less than the thickness x1 of the lower portion 91 of the oxide layer.

Figure 10:
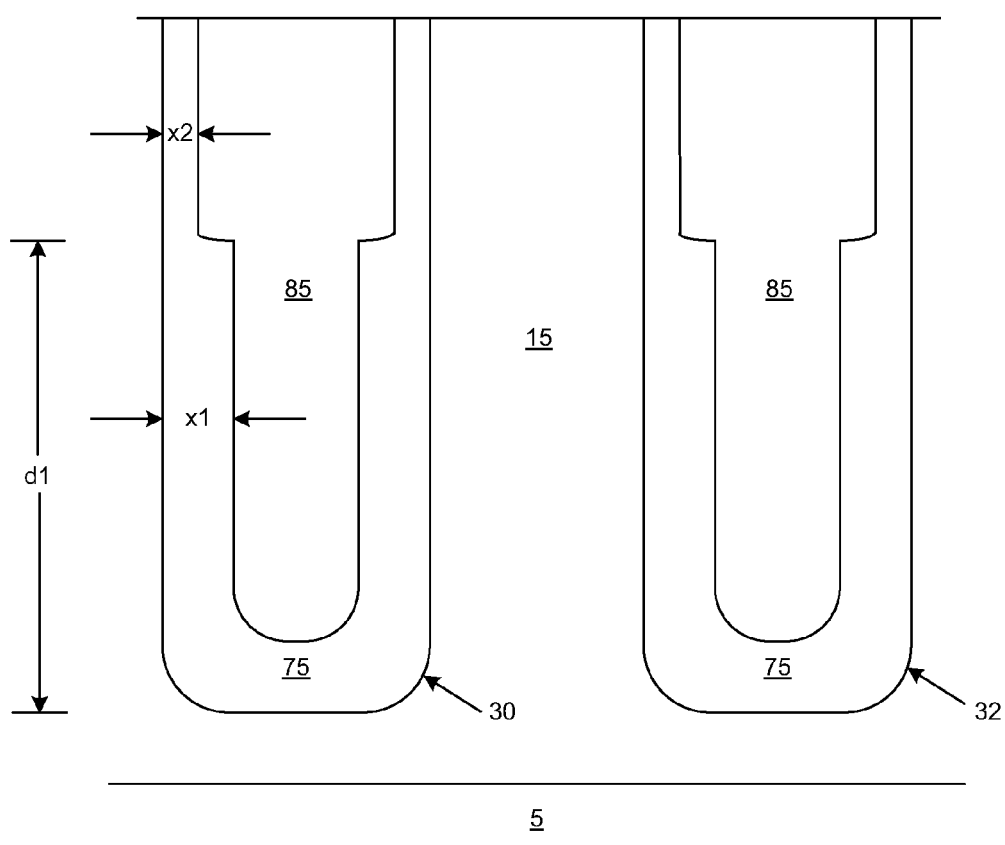

In block 510 of FIG. 5, with reference to FIG. 10, the operations of blocks 506 and/or 508 are repeated to achieve a desired profile for the oxide layer 75.

More specifically, some or all of the remaining volume of the trench 30 is filled with the same material 85 that was deposited in block 506 above. If only some of the remaining volume is filled similar to the operation of block 506 above, the exposed portion of the oxide layer 75 can be etched back again to further thin that portion of the oxide layer, similar to the operation of block 508.

In general, before the trench 30 is completely filled with the material 85, the operations of blocks 506 and 508 can be repeated as many times as necessary to achieve a desired profile (cross-section) for the oxide layer 75. For example, the operations of blocks 506 and 508 can be performed three times to achieve the profile in the example of FIG. 2. If only a single step in the thickness of the oxide layer 75 is to be formed (e.g., as in the example of FIG. 3), then the remaining volume of the trench 30 is filled after the oxide layer is etched back a single time in block 508.

Once the trench 30 is completely filled, excess material can be removed using, for example, CMP (chemical mechanical planarization or polishing) so that the top surface of material in the trench 30 (the filler material 85 and the oxide layer 75) is flush with adjacent surfaces.

Figure 11:
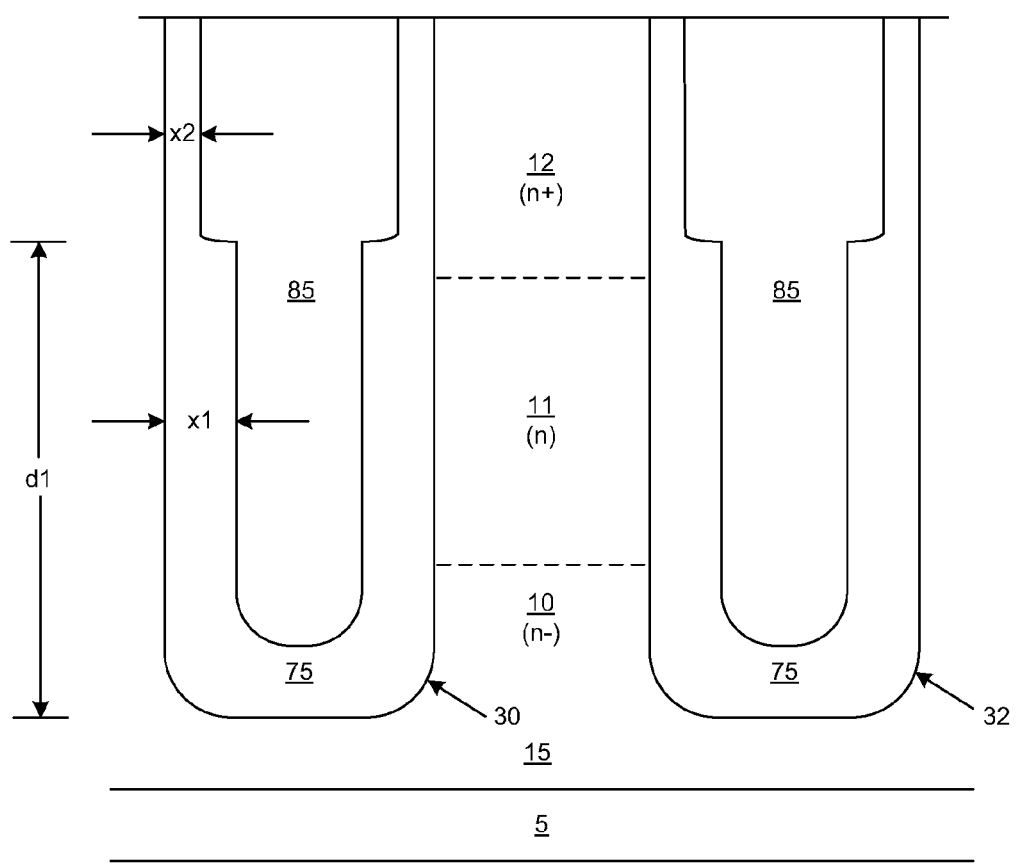

In block 512 of FIG. 5, with reference to FIG. 11, in an embodiment, dopant is added to the epitaxial layer 15 in one or more process steps, to increase the concentration of dopant in some regions of the epitaxial layer relative to other regions of the epitaxial layer, as described above. For example, in an embodiment, additional dopant can be driven into the regions of the epitaxial layer 15 corresponding to the regions 11 and 12, to increase their dopant concentration relative to the region 10. Then, additional dopant can again be driven into the region 12, to increase its dopant concentration relative to the region 11.

However, embodiments according to the invention are not limited to the example of FIG. 11. In general, as previously described herein, dopant is added to the epitaxial layer 15 to produce a non-uniform concentration of dopant in the epitaxial layer, where the concentration varies according to the thickness of the oxide layer 75. More specifically, the dopant concentration may be higher in a region of the epitaxial layer 15 adjacent to a thinner portion of the oxide layer 75, and the dopant concentration may be lower in a region of the epitaxial layer adjacent to a thicker portion of the oxide layer.

Also, the various dopant concentrations in the epitaxial layer 15 can be introduced at any point before, after, or while the other operations included in the flowchart 500 are performed. For example, the epitaxial layer 15 can be doped before the trench 30 is etched; that is, the trench can be etched in an epitaxial layer that has already been doped.

Figure 12:
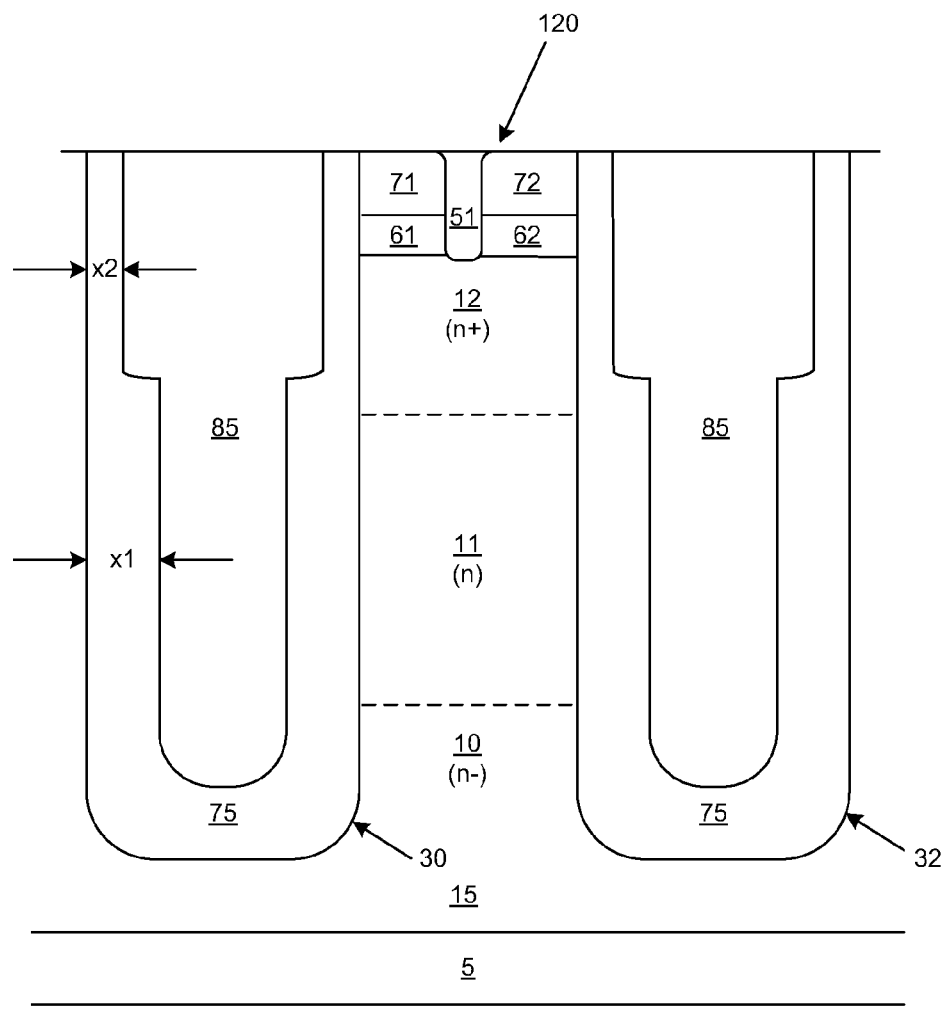

In block 514 of FIG. 5, with reference to FIG. 12, a device or structure is formed in the region 120 adjacent to the trench 30. In an embodiment, a second trench 51 (e.g., a gate trench) that is shallower than the trench 30 is formed, an oxide layer (not shown) is grown inside the second trench, a material (e.g., polysilicon) is added inside the second trench, excess material is removed using CMP for example, the body regions 61 and 62 are formed, and the source regions 71 and 72 are formed.

Figure 13:
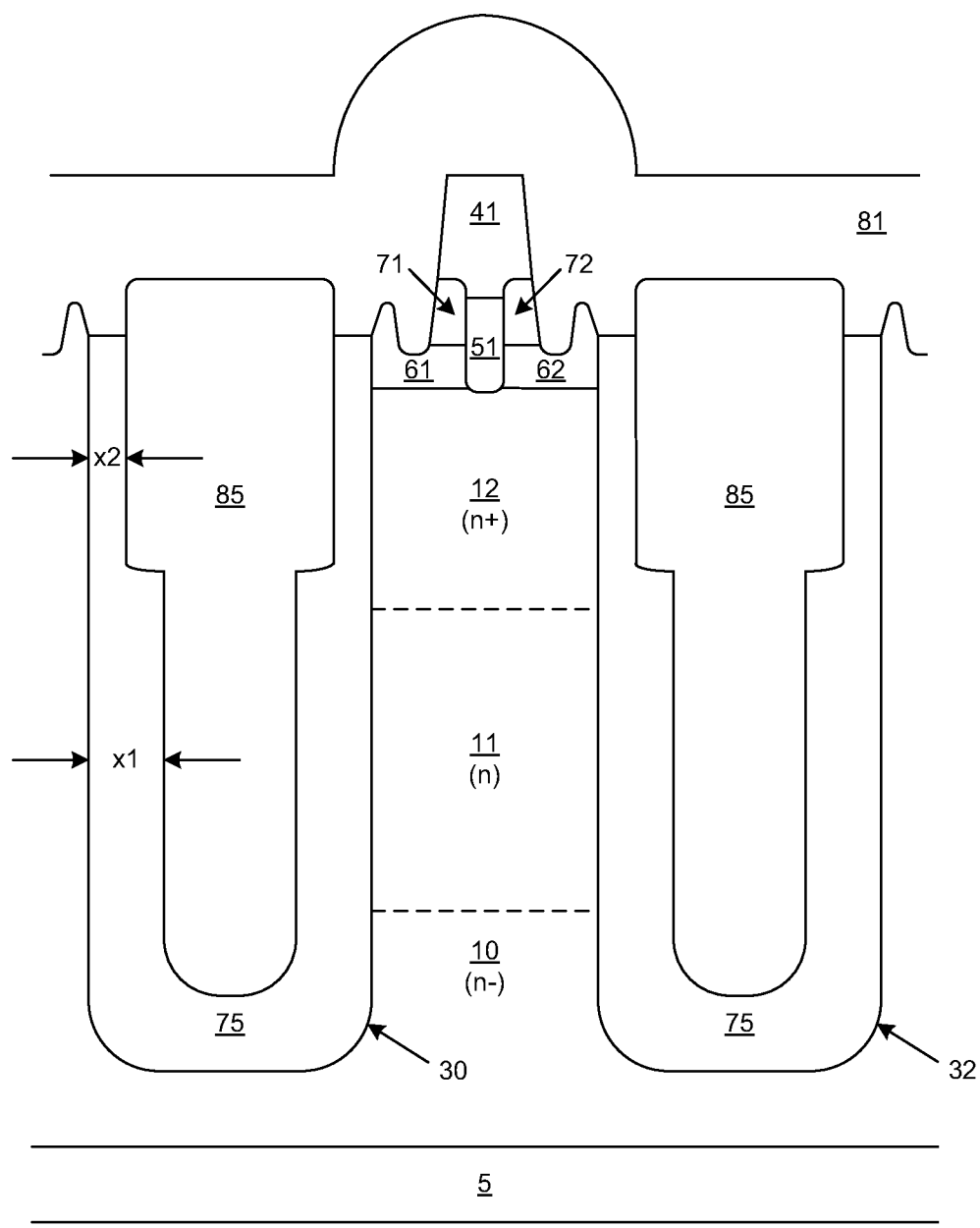

In block 516 of FIG. 5, with reference to FIG. 13, openings to the source regions 71 and 72 are formed, a dielectric region 41 is formed over the trench structure that includes the trench 51, and a metal layer is deposited to form the source electrode 81 in contact with the material 85 in the source trenches as well as the body regions 61 and 62 and the source regions 71 and 72.

Embodiments of semiconductor devices and of methods of fabricating the semiconductor devices are thus described. In these embodiments, semiconductor devices, such as but not limited to power MOSFETs including but not limited to dual trench MOSFETs, have non-uniform oxide layers lining the trenches that are connected to the source electrode. Such devices will have lower resistivity in the drift region and lower on-state resistance but will have the same or about the same breakdown voltage relative to conventional devices.

The features described herein can be used in lower voltage devices (e.g., in the range of 100-250 V) as well as higher voltage devices (e.g., in the range of 400-600 V).

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device, comprising:
a substrate layer;
an epitaxial layer adjacent to the substrate layer;
a first trench structure formed in the epitaxial layer and having a bottom and sidewalls, wherein the first trench structure further comprises filler material in contact with a source electrode; and
an oxide layer that lines the sidewalls, the oxide layer having a non-uniform thickness along the sidewalls, wherein the thickness of the oxide layer at a first distance from the bottom is less than the thickness of the oxide layer at the bottom, and wherein the thickness of the oxide layer at a second distance from the bottom, greater than the first distance, is less than the thickness of the oxide layer at the first distance;
wherein the epitaxial layer has a non-uniform dopant concentration, wherein the non-uniform dopant concentration varies according to the thickness of the oxide layer adjacent thereto.

2. The semiconductor device of claim 1, wherein a region of the epitaxial layer at a depth corresponding to the first distance has a first dopant concentration, and a region of the epitaxial layer at a depth corresponding to the second distance has a second dopant concentration, wherein the first dopant concentration is less than the second dopant concentration.

3. The semiconductor device of claim 1, wherein the thickness of the oxide layer deceases linearly along a length of the sidewalls between the first distance and the second distance.

4. The semiconductor device of claim 1, wherein the oxide layer has a uniform first thickness from above the bottom of the first trench structure to the first distance, and has a uniform second thickness from the first distance to the second distance, the second thickness less than the first thickness.

5. The semiconductor device of claim 1, further comprising a structure formed adjacent to the first trench structure, the structure comprising: a second trench filled with material, a body region, and a source region.

6. A semiconductor device, comprising:
a substrate layer;
an epitaxial layer adjacent to the substrate layer;
a first trench structure formed in the epitaxial layer, the first trench structure having a bottom, a first sidewall, and a second sidewall, wherein the first trench structure further comprises filler material in contact with a source electrode; and
an oxide layer that lines the bottom and the first and second sidewalls, the oxide layer comprising a first portion that spans the bottom of the first trench structure from the first sidewall to the second sidewall, a second portion extending from the first portion along the first sidewall, and a third portion extending from the second portion along the first sidewall, wherein the oxide layer has a first thickness in the second portion and a second thickness in the third portion, the second thickness less than the first thickness;
wherein the epitaxial layer comprises a first region neighboring the first portion of the oxide layer, a second region neighboring the second portion of the oxide layer, and a third region neighboring the third portion of the oxide layer, wherein the first region has a first dopant concentration, the second region has a second dopant concentration, and the third region has a third dopant concentration, and wherein the third dopant concentration is greater than the second dopant concentration, and the second dopant concentration is greater than the first dopant concentration.

7. The semiconductor device of claim 6, wherein the first thickness decreases linearly as distance from the bottom increases, and wherein the second thickness decreases linearly as distance from the bottom increases.

8. The semiconductor device of claim 6, wherein the first thickness is uniform in the second portion of the oxide layer, and wherein the second thickness is uniform in the third portion of the oxide layer, the second thickness less than the first thickness.

9. The semiconductor device of claim 6, further comprising a structure formed adjacent to the first trench structure, the structure comprising: a second trench filled with material, a body region, and a source region.

10. A semiconductor device, comprising:
a substrate layer;
an epitaxial layer adjacent to the substrate layer;
a first trench structure formed in the epitaxial layer and having a bottom and sidewalls, wherein the first trench structure further comprises filler material in contact with a source electrode; and
an oxide layer that lines the sidewalls, the oxide layer having a non-uniform thickness along the sidewalls, wherein the thickness of the oxide layer at a first distance from the bottom is less than the thickness of the oxide layer at the bottom, and wherein the thickness of the oxide layer at a second distance from the bottom, greater than the first distance, is less than the thickness of the oxide layer at the first distance
wherein a region of the epitaxial layer at a depth corresponding to the first distance has a first dopant concentration, and a region of the epitaxial layer at a depth corresponding to the second distance has a second dopant concentration, and wherein the first dopant concentration is less than the second dopant concentration.

11. The semiconductor device of claim 10, wherein the thickness of the oxide layer deceases linearly along a length of the sidewalls between the first distance and the second distance.

12. The semiconductor device of claim 10, wherein the oxide layer has a uniform first thickness from above the bottom of the first trench structure to the first distance, and has a uniform second thickness from the first distance to the second distance, the second thickness less than the first thickness.

13. The semiconductor device of claim 10, further comprising a structure formed adjacent to the first trench structure, the structure comprising: a second trench filled with material, a body region, and a source region.

* * * * *